United States Patent [19]
Rodriguez

[11] 3,974,006
[45] Aug. 10, 1976

[54] METHOD OF OBTAINING HIGH TEMPERATURE RESISTANT ASSEMBLIES COMPRISING ISOLATED SILICON ISLANDS BONDED TO A SUBSTRATE

[76] Inventor: Valentin Rodriguez, 6, Square Chardin - Parly 2, 78140 Le Chesnay, Spain

[22] Filed: Mar. 21, 1975

[21] Appl. No.: 560,813

[52] U.S. Cl. .................................. 156/3; 156/17; 204/129.1; 428/428
[51] Int. Cl.² ............................................ H01L 7/50
[58] Field of Search ............... 29/580, 583; 357/47, 357/49; 428/428; 427/93, 95; 156/3, 11, 17; 204/129.1

[56] References Cited
UNITED STATES PATENTS

| | | | |
|---|---|---|---|
| 3,457,123 | 7/1969 | VanPul | 29/580 X |
| 3,689,357 | 9/1972 | Jordan | 156/17 X |

Primary Examiner—William A. Powell
Attorney, Agent, or Firm—Kemon, Palmer & Estabrook

[57] ABSTRACT

A method is described for obtaining high temperature resistant assemblies comprising isolated silicon islands bonded to a substrate in view of the manufacture of bipolar or MOS circuit element built-in devices. The flat surface of an initial wafer comprising a silicon layer wherein unisolated silicon islands are nested within a silicon oxide layer otherwise having a planar interface with the silicon layer is totally oxidized and coated with a thicker insulating layer at least part of which is comprised of silicon oxide up to an exposed surface, and a second substrate at least the surface of which is comprised of silicon oxide is bonded to the said exposed oxide surface by fusion of an intermediate phosphosilicate glass layer between said two oxide surfaces. Thereafter, the silicon material of the initial wafer is removed up to the said interface.

13 Claims, 8 Drawing Figures

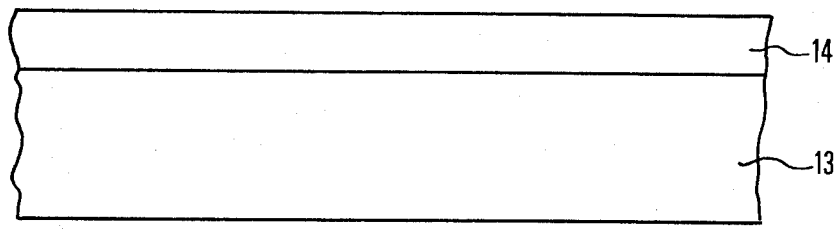
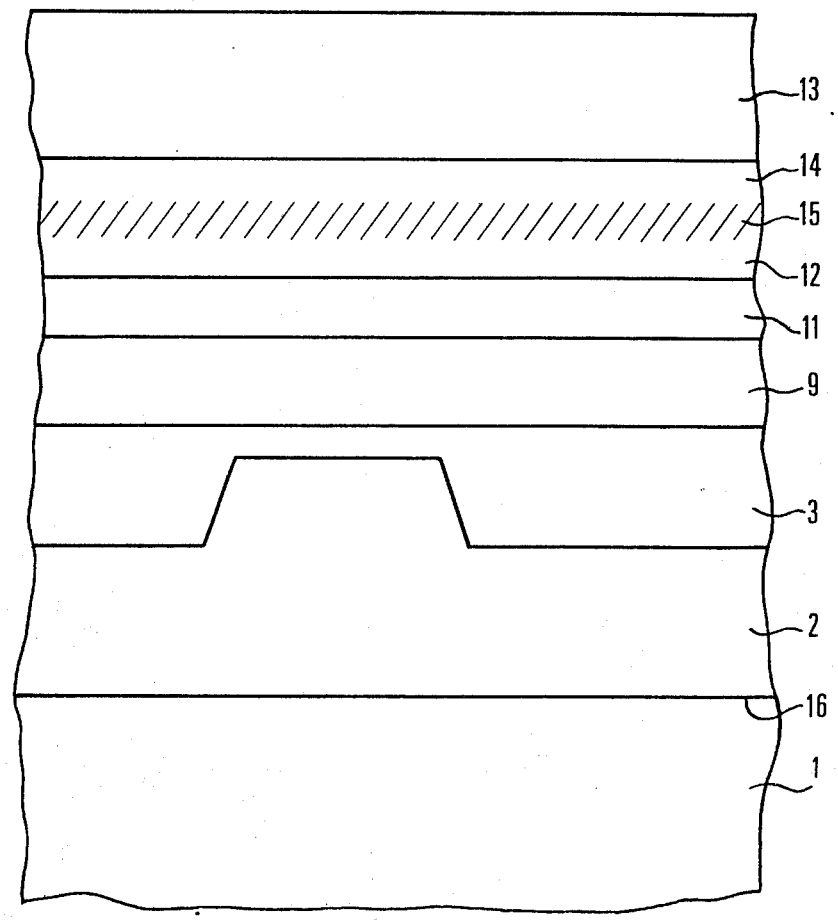

METHOD OF OBTAINING HIGH TEMPERATURE RESISTANT ASSEMBLIES COMPRISING ISOLATED SILICON ISLANDS BONDED TO A SUBSTRATE

SUMMARY OF THE INVENTION

The present invention concerns improvements in or relating to the technique for manufacturing integrated built-in devices comprising bipolar and MOS (i.e. metal-oxide-semiconductor) circuit elements.

In such devices the circuit elements are formed in and on silicon islands which must be totally isolated from the substrate in order to avoid stray capacities and to speed up the response of the circuits. Varied and usually costly methods have been provided for obtaining an assembly wherein silicon islands are totally isolated from the substrate. For instance, for preparing an assembly suitable for the subsequent formation of bipolar circuit elements, one had recourse to a low temperature epitaxial growth of silicon on a substrate and to isolation diffusions to isolate the elements. For instance, too, for preparing an assembly suitable for the subsequent formation of MOS circuit elements, and more particularly of C MOS circuit elements (C for "complementary"), recourse has been made to high price substrates as sappire and spinel. Another line of investigation recourses to transfer of substrates: — a plurality of unisolated silicon islands are first developed on a silicon substrate, which is a temporary one, and a final substrate is thereafter bonded over exposed faces of the islands and the temporary substrate is then removed up to the obtention of isolated silicon islands.

The present invention is mainly concerned with the last above mentioned line. To Applicant's knowledge, the methods presently developed along this line of investigation suffer of two main drawbacks: — one is situated at the level of the bond, and consists of a deficiency of the bond to later ensure an appropriate strength when the assembly will be submitted to thermal treatments at as high temperatures as substantially comprised between 1000° to 1350° C.; — the second is situated at the level of the removal of the temporary, or "initial", substrate, as such removal must leave the exposed surfaces of the silicon islands in due parallelism to the opposite face of the "final" substrate. It may be noted that, when speaking of the "bond," Applicant objects to any presence of metallic layer in said bond as Applicant estimates such a presence as deleterious for the finally made circuit elements.

It is an object of the invention to provide a method of obtaining isolated silicon islands bonded to a substrate in a final high temperature resistant assembly which does not suffer the above explained drawbacks.

Broadly stated, this method comprises the steps of preparing an initial silicon wafer on one side of which the silicon is oxidized in selective zones leaving a plurality of unisolated silicon islands nested in the silicon oxide with exposed surfaces flush with the oxide, the oxidized layer presenting in the wafer an internal interface with the silicon, oxidizing the whole surface to isolate the said exposed surfaces from the atmosphere, growing over the said wholly oxidized surface a thicker layer which is at least partially oxidized up to an exposed surface thereof, separately preparing a substrate member with an oxidized surface on one side, and uniting the two oxidized exposed surface by fusing a phosphosilicate glass therebetween, thereafter removing the silicon of the wafer up to the said interface, said removal comprising an electrolitically etching operation at least in the final step thereof.

The silicon initial wafer may be made of a bulk silicon or it may comprise a silicon substrate coated with an epitaxial silicon thinner layer on top thereof.

Growing the said thicker layer over the oxidized surface of the initial wafer may comprise the steps of depositing a polycrystalline silicon layer and thermally oxidizing the silicon thereof.

The silicon removing operation may begin by a lapping step prior the final electrolytical etching step.

BRIEF DESCRIPTION OF THE DRAWINGS

The foregoing and other objects, features and advantages of the invention will be described in full detail with reference to the accompanying drawings, wherein:

FIGS. 5 to 8 inclusive concern a preferred method of bonding the wafer structure of FIG. 2 to a dielectric substrate:

FIG. 5 shows the structure of FIG. 2 over which had been grown a thicker layer comprising at least a silicon oxide exposed face, FIG. 6 shows the structure of FIG. 5 over which a layer of phosphosilicate glass has been deposited, FIG. 7 shows the separately prepared dielectric substrate over an oxidized surface of which a layer of phosphosilicate glass has been deposited, and, FIG. 8 shows the finally obtained structure by fusing together the two glass layers, prior removal of the excedentary part of the silicon wafer.

These figures are only illustrative of possible embodiments of the invention and it may be understood that several modifications may be brought to these embodiments without departing from its spirit and scope, as for instance making the initial wafer in totally bulk silicon or providing a single glass layer instead of first distributing the glass in two separate layers.

DETAILED DESCRIPTION

Figure 1:
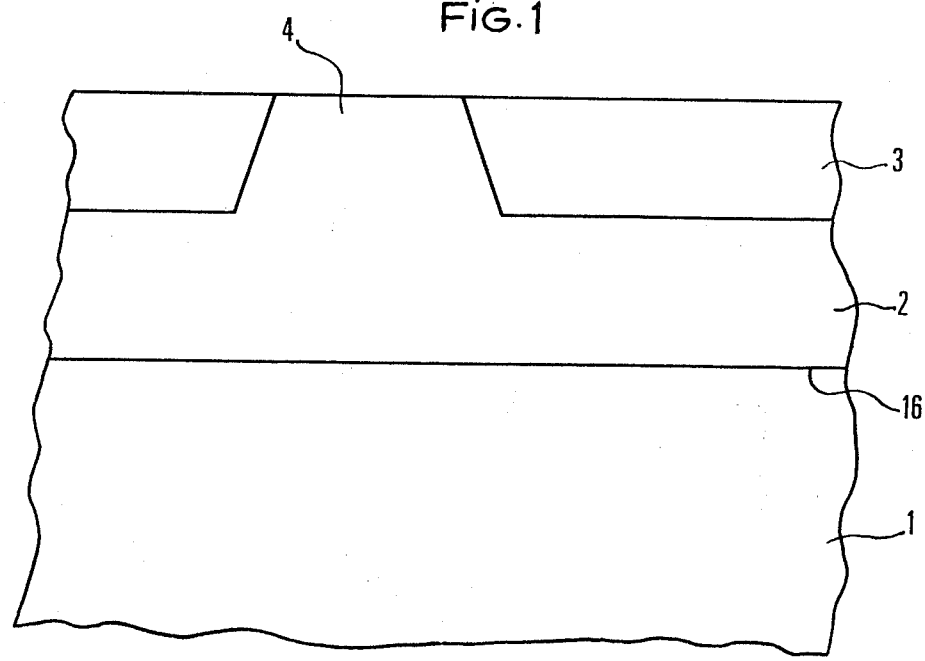
FIG. 1 shows a structure of an initially prepared wafer.

FIG. 1 shows an illustrative example of an initially prepared wafer comprised of a silicon substrate 1, for instance of about 250 microns thick, coated with an epitaxially deposited silicon layer 2, for instance about 5 microns thick, which has been selectively oxidized according to a well-known process at a depth, say, about 2 microns thick to create an oxide layer 3 wherein remain nested such silicon islands as 4 which are not isolated from the silicon layer 2. The epitaxial layer 2 is made of a polarity opposite to the polarity of the silicon substrate 1. As herein above said, the wafer may be provided in bulk silicon, so that the modification of the figures is obvious, it suffices to cancel the interface line 16.

In all the figures, for the sake of clarity and simplicity, no definite relative dimensions are drawn to any fixed scale. For the sake of simplicity too, the oxidation edges have been idealized for the islands.

Figure 2:
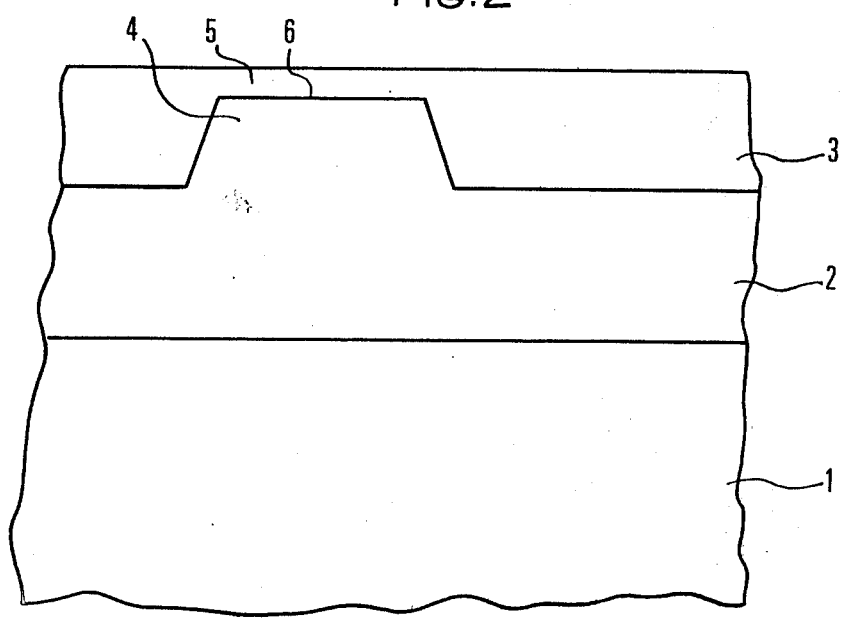
FIG. 2 shows the structure of FIG. 1 after its surface had been wholly oxidized.

The initial wafer which has thus been prepared is submitted to an additional oxidizing step which thermally converts into silicon oxide all the upper portions of the silicon islands 4 so that the top face of the wafer is totally oxidized, FIG. 2. The thickness of such parts as 5 is not critical for the method proper. It must be of course understood that the dimensions, resistivity, polarity and orientation of the silicon layers are plain functions of the intended application of the circuit elements which will later be made on the isolated islands.

Figure 3:
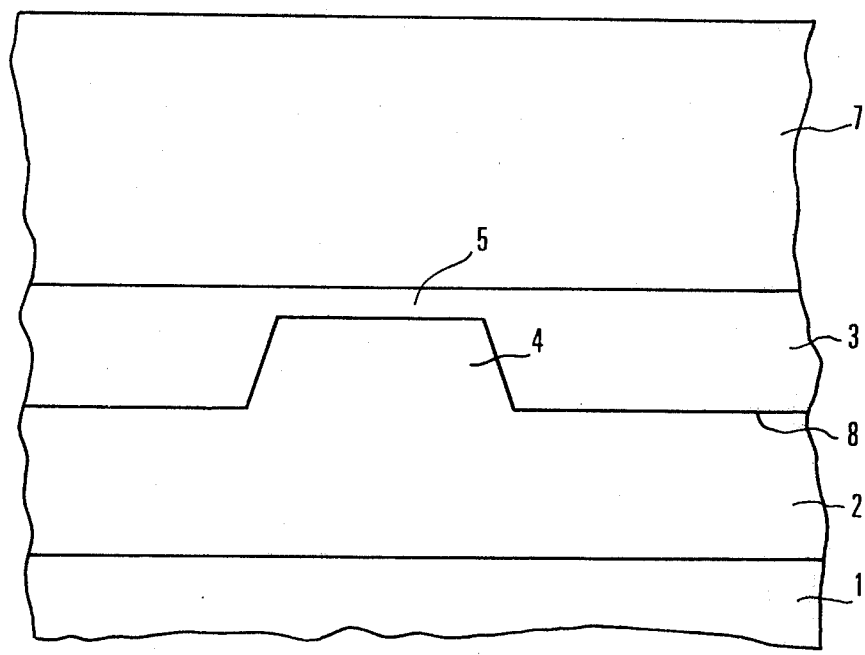
FIG. 3 shows the structure of FIG. 2 after a dielectric substrate member has been bonded over its oxide surface, and, FIG. 4 shows the structure of FIG. 3, after removal of the excedentary silicon in the initial wafer.
Figure 4:
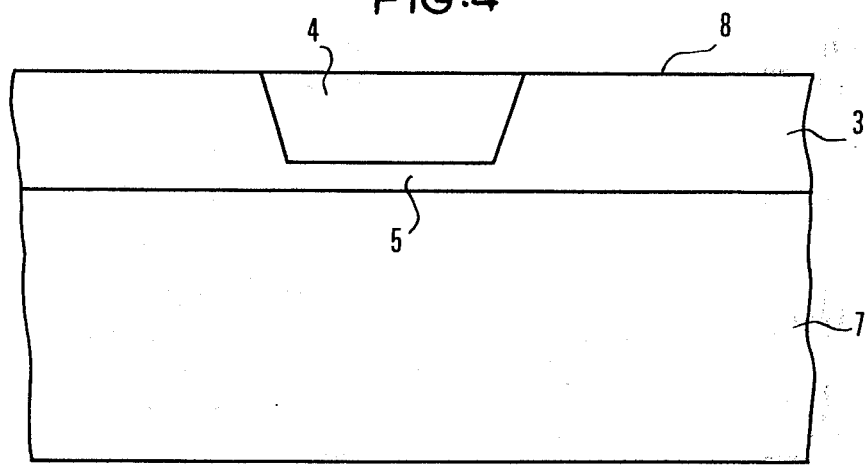
Figure 5:
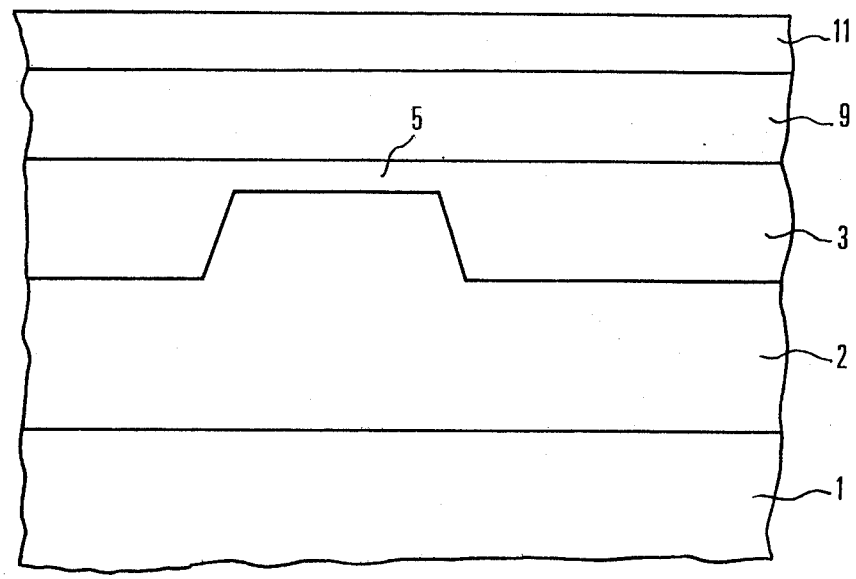

A final substrate 7 is then applied to the wafer and bonded thereto as it will be hereinbelow explained, so that the structure is such as shown of FIG. 3. Thereafter, the next and final step is the removal of the silicon of the wafer up to the silicon oxide/silicon interface 8, so that the islands 4 are isolated from the final substrate 7 and have their surfaces exposed at the said interface level 8. As the characteristics of the islands are substantially the same as those which could have been obtained with standard but more complex techniques, the circuit elements which will be later manufactured will exhibit the same characteristics as circuits elements from said standard techniques.

However such an assembly of isolated silicon islands on a substrate must first have accurate parallelism of its exposed faces and must further be capable of enduring heating stages at such temperatures as comprised between about 1000°C. and 1350°C. This second condition means that in such assemblies as obtained, the bond of the final substrate to the island carrying member must stand these temperatures.

The final substrate 7 could be provided as a thick layer of polycrystalline silicon grown over the oxidized surface of the initial wafer but, of course, such a method is utterly objectionable as the consumption of time to create such a layer up to the requested thickness and as whatever the deposition method which may be used, irregularities of the deposit will occur which could not be appropriately controlled. Lapping and polishing of the "back" face of such a layer will, in plus, be particularly hard to execute with due maintenance of parallelism of such a machined face with respect to the opposite face of the assembly, as, all the more, said opposite face itself must be machined for the removal of the excedentary silicon thereof.

The removal of the excedentary silicon may have recourse, in a first step thereof, to a lapping of the silicon wafer but this lapping, casually followed by a polishing operation, does not reach the level of the silicon/silicon oxide interface 8. The important point in the method of the invention is that the removal of the silicon of the neighbourhood of said interface be made of electrolytically etching away said silicon, because this etch will automatically stop at the said interface due to the interruption of the electrical continuity at the oxide reach. It must be noted that the level of said interface within the initial wafer can be accurately predetermined by controlling the oxidizing reaction when forming the layer 3.

Of course, the removal may be entirely made by the electrolytical etching technique, when desired. When, as illustrated the wafer is made of a "bulk" 1 coated by an epitaxial layer 2, and the epitaxial layer 2 has been deposited with a polarity opposite to that of the part 1, two successive steps must be observed. In a first step, the conditions of the etching are such that the silicon of the polarity of the bulk part 1 be attacked. Theoretically, at least, such etch will automatically stop at the interface 16 between 1 and 2, provided this interface is neatly defined. Thereafter, the electrolytic etching conditions are changed for the removal of the silicon of the layer and this reaction will automatically stop at the interface 8 which, as said, is always accurately defined. It may consequently be used as a reference.

When the final substrate 7 is bonded to the wafer, as herein above explained, the bonding operation implies application of temperatures that may entail some degree of diffusion of the impurities of one of the layers 1–2 within the other one. This results in a certain vagueness of the interface 16 after the bond. This is a reason why it is probably preferable to remove the silicon of the wafer by a chemical etch which attacks selectively highly doped silicon and which by definition will stop at the epitaxial-bulk interface. This chemical removal up to the above mentioned interface will provide a degree of parallelism between the exposed etched surface and the oxide-epitaxial interface. Subsequently the remaining silicon to the epitaxial-oxide interface is removed with an electrolytic etch.

Of course such a problem does not exist when the initial wafer comprises a bulk silicon body. Electrolytic etch may be plainly applied.

According to the complementary approach of the invention for satisfying the objects thereof, the bonding operation of the final substrate to the initial wafer of FIG. 2 is substantially provided in accordance to the method disclosed in relation to FIGS. 5 to 8.

A layer of polycrystalline silicon, about for instance 1 to 5 microns thick, is formed over the totally oxidized surface of the wafer structure of FIG. 2. Thereafter said layer is thermally oxidized in part at least of its thickness. This is illustrated by the layers 9 and 11 in FIG. 5 but it may be understood that, specially when the thickness of the polycristalline layer is not high, i.e. about 1 micron and up to about 2, the layer may be totally oxidized. Direct deposition of silicon oxide $SiO_2$ is, too, conceivable for the formation of such a layer 9–11.

Figure 6:
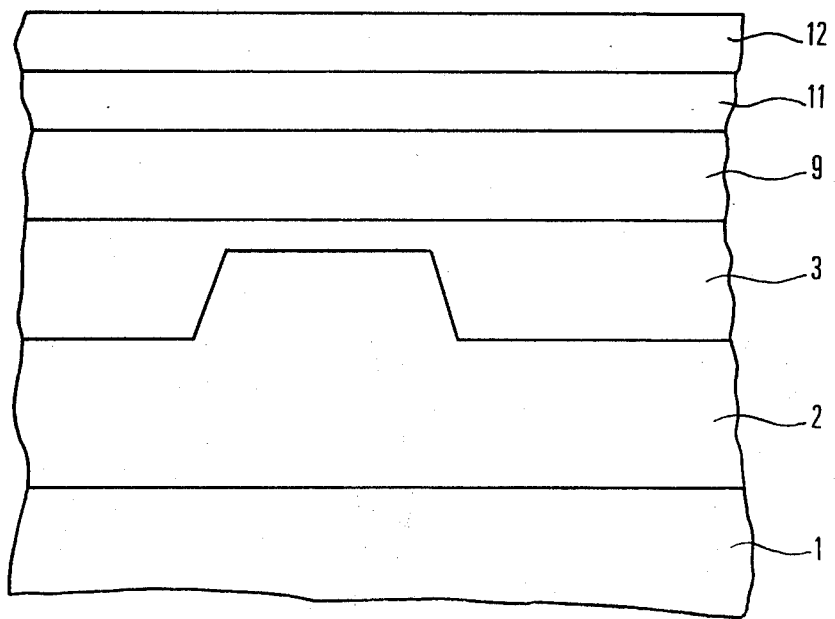

The next step, the result of which is shown on FIG. 6, is to apply over 11 a layer 12 of a phosphosilicate glass $SiO_2$—$P_2O_5$, which has been found as the most suitable glass for reducing the invention into practice. The layer 12 may be a film about 1 micron thick. It may be prepared from a solution mixing about four parts of $SiH_4$ to one part of $PH_3$ at a moderately high temperature.

The final substrate, FIG. 7, is separately prepared and may be comprised of a silicon substrate 13, in bulk form, over which is formed a similar phosphosilicate glass layer 14. At least the part of 13 adjacent to the face which receives such a glass film 14 has previously be thermally oxidized, if not the complete body of 13.

The two prepared members are assembled as shown on FIG. 8. They are applied one against the other by their respective glass films 12 and 14 and the combination is heated to an appropriate temperature to ensure the fusion of the glass in the zone 15 which results in an intimate bond between the said members. The temperature is selected in a range from about 1000°C. up to 1350°C. and, for instance about 1100°C.

During fusion when the glass films are above their melting point, the phosphor of the glass diffuses into the thermal oxide such that the content of the initial glass in phosphoric anhydride $P_2O_5$ is reduced. Consequently, the melting point of the bond is increased beyond the initial value and thus the maximum temperature value that the final assembly can withstand without any deformation and distorsion. This is an important advantage since high temperature steps will be needed for the formation of the circuit elements on the isolated islands.

It may be noted that the above described method eliminates recourse to masking steps for side and bottom isolation of the islands. The resulting assemblies will enable a higher density of circuit elements, mainly bipolar circuit ones. In the MOS technique, specially in the C MOS technique, the elements can consequently be made on an insulating substrate with a silicon material presenting the same characteristics as bulk silicon.

As any individual step of the method actually is now trivial in the art, said steps do not necessitate individual detailed description.

What is claimed is:

1. A method of obtaining high temperature resistant assemblies comprising isolated silicon islands bonded to a substrate, comprising the steps of:
    preparing an initial wafer comprised of a silicon member having unisolated silicon islands nested within a layer of silicon oxide having an interface with the silicon material at the base level of said islands and having an exposed surface level with the exposed faces of the islands,
    oxidizing the complete surface of the exposed silicon oxide layer and the exposed surfaces of the islands,
    forming a dielectric layer over the said completely oxidized surface, said dielectric layer having at least its exposed surface comprised of silicon oxide,
    separately preparing a substrate having at least an exposed surface comprised of silicon oxide,
    uniting the said two surfaces of silicon oxide with a phosphosilicate glass at a fusion temperature producing diffusion of the glass into the oxide,
    removing the silicon of said wafer up to the level of the said interface, said removal operation comprising an electrolitic etching step at least as the final step thereof.

2. Method according to claim 1, wherein the uniting step comprises deposition of a glass film over each of the said oxide surfaces prior application of the said films one against the other and heating the combination.

3. Method according to claim 1, wherein said removal operation comprises a first chemical etching step prior the electrolytic etching step.

4. Method according to claim 1, wherein the formation of said dielectric layer comprises the steps of growing a layer of polycristalline silicon over the completely oxidized surface of the wafer and thereafter thermally oxidizing the polycristalline silicon.

5. Method according to claim 1, wherein the formation of said dielectric layer comprises growing of a layer of silicon oxide over the completely oxidized surface of the wafer.

6. Method according to claim 1, wherein the initial wafer is comprised of bulk silicon and the layer of selectively formed oxide layer is provided therein from a selective thermal oxidizing step.

7. Method according to claim 1, wherein the initial wafer is comprised of a bulk silicon substrate coated with an epitaxial silicon layer of opposite polarity than the bulk silicon substrate and a layer of selectively formed silicon oxide is provided in the said epitaxial silicon layer at a depth not outpassing the thickness of the said silicon layer.

8. Method according to claim 1, wherein the separate preparation of said substrate comprises the step of oxidizing a thick polycrystalline silicon layer.

9. Method according to claim 3, wherein the initial wafer is comprised of a selectively oxidized epitaxial silicon layer over a bulk silicon base, and the said first chemical etching step reaches the bulk-epitaxial interface.

10. A method of obtaining high temperature resistant assemblies comprising isolated silicon islands bonded to a substrate, comprising the steps of:
    preparing an initial wafer comprised of a silicon member having unisolated silicon islands nested within a layer of silicon oxide having an interface with the silicon at the level of the bases of said islands and having an oxidized surface dielectric layer coated over the said layer of silicon oxide and over the surfaces of said islands nested within said oxide,
    preparing a substrate having a silicon oxide coated surface,
    uniting said prepared wafer and said prepared substrate by fusing a phosphosilicate glass between the two silicon oxide surfaces of the two members, and,
    removing the silicon of the initial wafer to the level of the said interface.

11. Method according to claim 10, wherein said removal comprises, at least as a final step thereof, an electrolytic etching of the said silicon material.

12. Method according to claim 10, wherein said substrate is comprised of a polycrystalline silicon body which has been thermally oxidized at least in a zone starting from one face thereof.

13. Method according to claim 10, wherein the preparations of the said initial wafer and the said substrate each comprises the step of forming a film of a phosphosilicate glass having a melting point temperature of about 1000°C. over the oxidized surface thereof and said uniting operation comprises heating the combination of said wafer and said substrate applied one against the other by contacting the said glass films to a higher temperature ensuring glass diffusion within the silicon oxide thereby increasing the melting point of the resulting glass higher than the initial value.

* * * * *